United States Patent
Hood et al.

(10) Patent No.: US 10,377,508 B2
(45) Date of Patent: Aug. 13, 2019

(54) ENHANCED TOOLING FOR INTERFERENCE-FIT FASTENERS

(71) Applicant: The Boeing Company, Chicago, IL (US)

(72) Inventors: William Donald Hood, Renton, WA (US); Donald Brian Peterson, Mill Creek, WA (US); Curtis Leon Hayes, Kirkland, WA (US); Paul Michael Haworth, Mill Creek, WA (US); Tyler James Kumley, Lake Stevens, WA (US)

(73) Assignee: The Boeing Company, Chicago, IL (US)

( * ) Notice: Subject to any disclaimer, the term of this patent is extended or adjusted under 35 U.S.C. 154(b) by 388 days.

(21) Appl. No.: 15/364,208

(22) Filed: Nov. 29, 2016

(65) Prior Publication Data

US 2018/0148194 A1    May 31, 2018

(51) Int. Cl.
    *B21J 15/02*      (2006.01)
    *B64F 5/10*       (2017.01)
    (Continued)

(52) U.S. Cl.
    CPC ............ *B64F 5/10* (2017.01); *B21J 15/02* (2013.01); *B21J 15/04* (2013.01); *B21J 15/142* (2013.01); *B21J 15/36* (2013.01); *B64C 1/12* (2013.01); *C23C 14/0611* (2013.01); *C23C 14/221* (2013.01); *C23C 14/24* (2013.01); *C23C 14/34* (2013.01); *C23C 16/27* (2013.01)

(58) Field of Classification Search
CPC ... B21J 15/00; B21J 15/36; B21J 15/04; B21J 15/02; B21J 15/365; B21J 15/40; B21J 15/42; Y10T 29/49885; Y10T 29/49888; Y10T 29/49982; Y10T 29/49986
See application file for complete search history.

(56) References Cited

U.S. PATENT DOCUMENTS 5,680,690 A * 10/1997 Briles ............... B21J 15/02
                                              29/458
6,298,543 B1 * 10/2001 Shore ............... B21J 15/02
                                          29/243.53

(Continued)

OTHER PUBLICATIONS

Curtis Hayes; Coated Rivet Dies: A Dramatic Improvement in Rivet Interference Profile; SAE Technical Paper 2016-01-2084. 2016.

(Continued)

*Primary Examiner* — Jason L Vaughan
*Assistant Examiner* — Amanda Kreiling
(74) *Attorney, Agent, or Firm* — Duft & Bornsen, PC (57) ABSTRACT

Systems and methods are provided for installing fasteners. One exemplary embodiment is a method that includes inserting a fastener into a hole, and gripping ends of the fastener via dies. At least one of the dies includes a permanent coating having a static friction coefficient of less than 0.2 at a surface contacting the fastener. The method further includes plastically deforming the fastener via force from the dies, thereby expanding the fastener into interference with the hole along a length of the fastener such that an amount of interference between the fastener and the hole along the length of the fastener is greater than one and a half thousandths of an inch and less than twenty thousandths of an inch.

30 Claims, 11 Drawing Sheets

(51) Int. Cl.
*B21J 15/04* (2006.01)
*B21J 15/14* (2006.01)
*B64C 1/12* (2006.01)
*C23C 14/06* (2006.01)
*C23C 14/22* (2006.01)
*C23C 14/24* (2006.01)
*C23C 14/34* (2006.01)
*C23C 16/27* (2006.01)
*B21J 15/36* (2006.01)

(56) References Cited

U.S. PATENT DOCUMENTS

| | | |
|---|---|---|
| 6,740,393 B1 | 5/2004 | Massler et al. |
| 8,105,660 B2 | 1/2012 | Tudhope et al. |
| 2002/0038566 A1* | 4/2002 | Jokisch ............... B21J 15/025 72/462 |

OTHER PUBLICATIONS

Diamond-like carbon; Wikipedia, the free encyclopedia; Oct. 10, 2016.

European Examination Report; Application 17204329.1-1016; dated Jan. 29, 2019.

\* cited by examiner

FIG. 14

ENHANCED TOOLING FOR INTERFERENCE-FIT FASTENERS

FIELD

The disclosure relates to the field of mechanical fasteners.

BACKGROUND

Fasteners are used in the aerospace industry to mechanically unite various structural components of an aircraft. For example, metal panels that form a portion of a skin of an aircraft wing may be joined to other metal parts via bolts or rivets. In aircraft structures, it is often desirable to install rivets in interference, meaning that the rivet diameter after installation is larger than the diameter of the hole that receives it. Interference fit installation of rivets can facilitate aircraft assembly operations and improve joint performance, particularly fatigue performance. As fasteners are intended to enhance the structural strength of an aircraft, it remains desirable to ensure that the act of installing a fastener does not damage underlying structural components of the aircraft. Specifically, too much radial interference at ends of the rivets is undesirable.

The process of upsetting rivets may be further complicated when using the rivet to attach different components together, such as a wing skin of an aircraft and an underlying stringer. In such environments, it may be desirable to control the amount of radial interference the rivets achieve along the axial length of the rivet throughout the hole in which it is installed. Too little radial interference is undesirable at an axial location.

SUMMARY

Embodiments described herein utilize enhanced tooling for installing fasteners. The enhanced tooling described herein includes a permanent coating with a low coefficient of friction. The low coefficient of friction ensures that plastic deformation of a rivet during installation results in a desired range of interference between the fastener and the hole throughout the length of the hole.

One embodiment is a method that includes inserting a fastener into a hole, and gripping ends of the fastener via dies. At least one of the dies includes a permanent coating having a static friction coefficient of less than 0.2 at a surface contacting the fastener. The method further includes plastically deforming the fastener via force from the dies, thereby expanding the fastener into interference with the hole along a length of the fastener such that an amount of interference between the fastener and the hole along the length of the fastener is greater than one and a half thousandths of an inch and less than twenty thousandths of an inch.

A further embodiment is a method that includes selecting a die that applies force which plastically deforms a fastener in order to expand the fastener into interference with a hole, and selecting a coating having a static coefficient of friction of less than 0.2. The method further includes permanently applying the coating to the die at a surface that will contact the fastener, thereby ensuring that plastic deforming of the fastener via force from the die will cause an amount of interference between the fastener and the hole along a length of the fastener between one and a half thousandths of an inch and twenty thousandths of an inch.

A further embodiment is a system that includes multiple dies that secure a fastener at a hole. The dies include a first die that contacts a first end of the fastener, and a second die that contacts a second end of the fastener. The second die includes a permanent coating having a static friction coefficient of less than 0.2 at a surface contacting the fastener and the dies together apply force that plastically deforms the fastener, thereby expanding the fastener into interference with the hole along a length of the fastener.

A further embodiment is a method that includes inserting a fastener into a hole, and gripping the fastener via dies at ends of the fastener, at least one of the dies including a permanent coating having a static friction coefficient of less than 0.2 at a surface contacting the fastener. The method further includes plastically deforming the fastener via force from the dies, which results in columnar bulging that causes interference between the fastener and the hole along a length of the fastener such that a ratio of a maximum amount of interference to a minimum amount of interference along the entire length of the fastener is less than four.

A further embodiment is an apparatus that includes a first part, a second part, and a fastener placed within a hole that bridges the first part and the second part, the fastener securing the first part and second part together. The fastener has been plastically deformed, thereby expanding the fastener into interference with the hole along an entire length of the fastener, such that a ratio of a maximum amount of interference to a minimum amount of interference along the entire length of the fastener is less than four.

Yet another embodiment is a method that includes inserting a fastener into a hole, and gripping ends of the fastener via dies. The method further includes plastically deforming the fastener into interference with the hole via force from the dies. A majority of plastic deformation at the fastener along an entire axial length of the fastener results in interference caused by columnar bulging of a shaft of the fastener in response to axial force from the dies.

Other exemplary embodiments (e.g., methods and computer-readable media relating to the foregoing embodiments) may be described below. The features, functions, and advantages that have been discussed can be achieved independently in various embodiments or may be combined in yet other embodiments further details of which can be seen with reference to the following description and drawings.

DESCRIPTION OF THE DRAWINGS

Some embodiments of the present disclosure are now described, by way of example only, and with reference to the accompanying drawings. The same reference number represents the same element or the same type of element on all drawings.

DESCRIPTION

The figures and the following description illustrate specific exemplary embodiments of the disclosure. It will thus be appreciated that those skilled in the art will be able to devise various arrangements that, although not explicitly described or shown herein, embody the principles of the disclosure and are included within the scope of the disclosure. Furthermore, any examples described herein are intended to aid in understanding the principles of the disclosure, and are to be construed as being without limitation to such specifically recited examples and conditions. As a result, the disclosure is not limited to the specific embodiments or examples described below, but by the claims and their equivalents.

Figure 1:
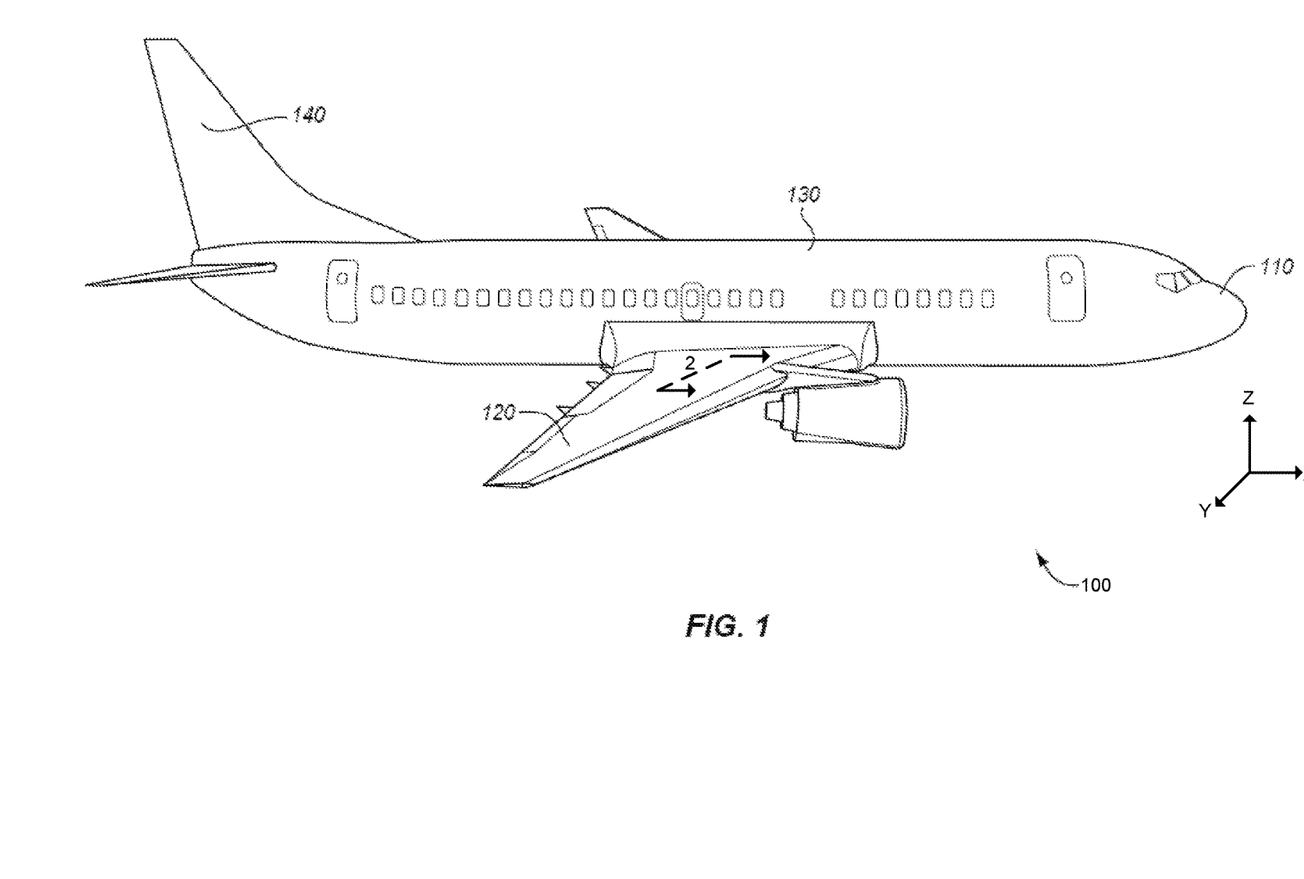
FIG. 1 is a diagram of an aircraft an exemplary embodiment.
Figure 2:
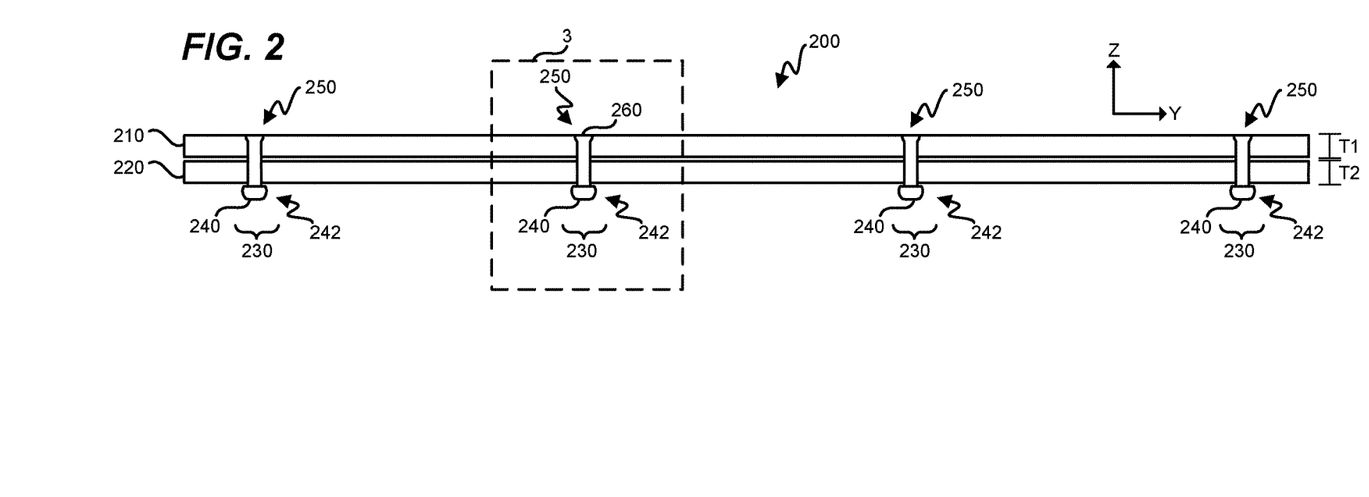
FIG. 2 is a partial section cut view of a section of structure of a wing in an exemplary embodiment.
Figure 3:
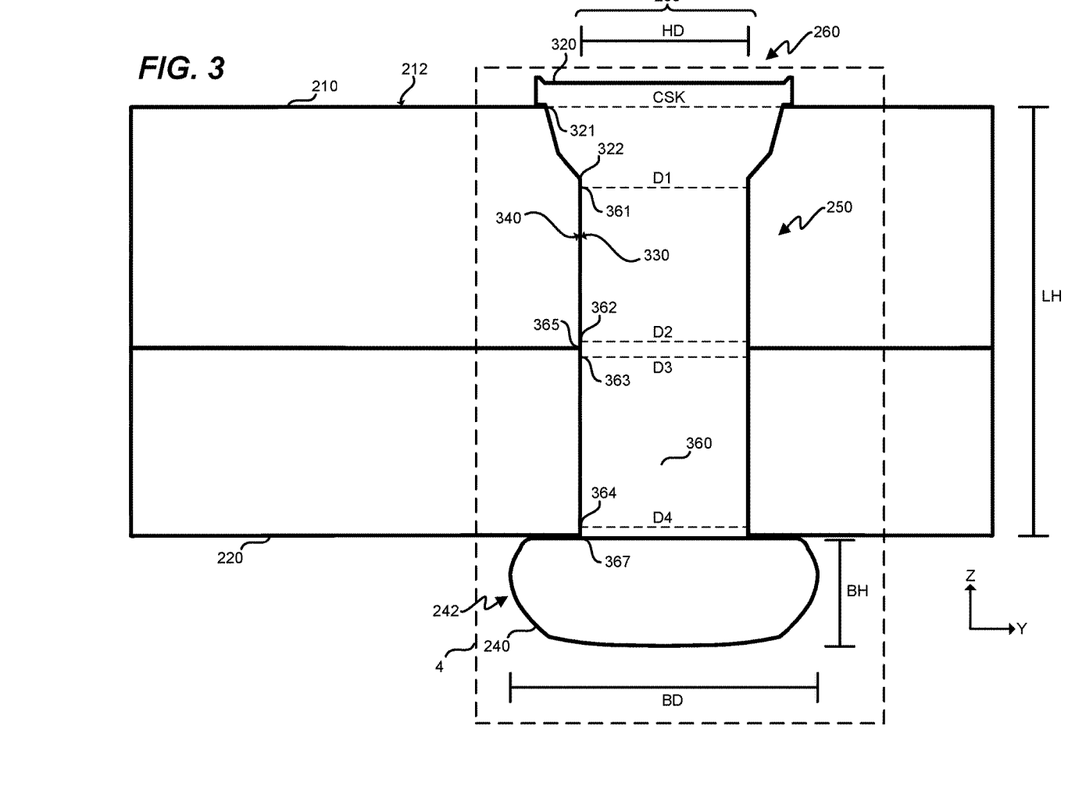
FIG. 3 is a zoomed-in view of a section of wing structure that includes a fastener in an exemplary embodiment.
Figure 4:
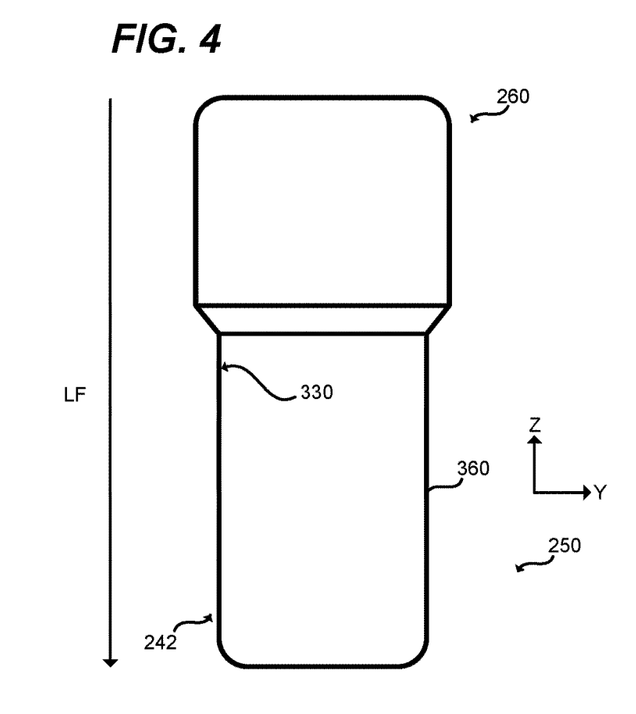
FIG. 4 is a view of a fastener prior to installation in an exemplary embodiment.
Figure 5:
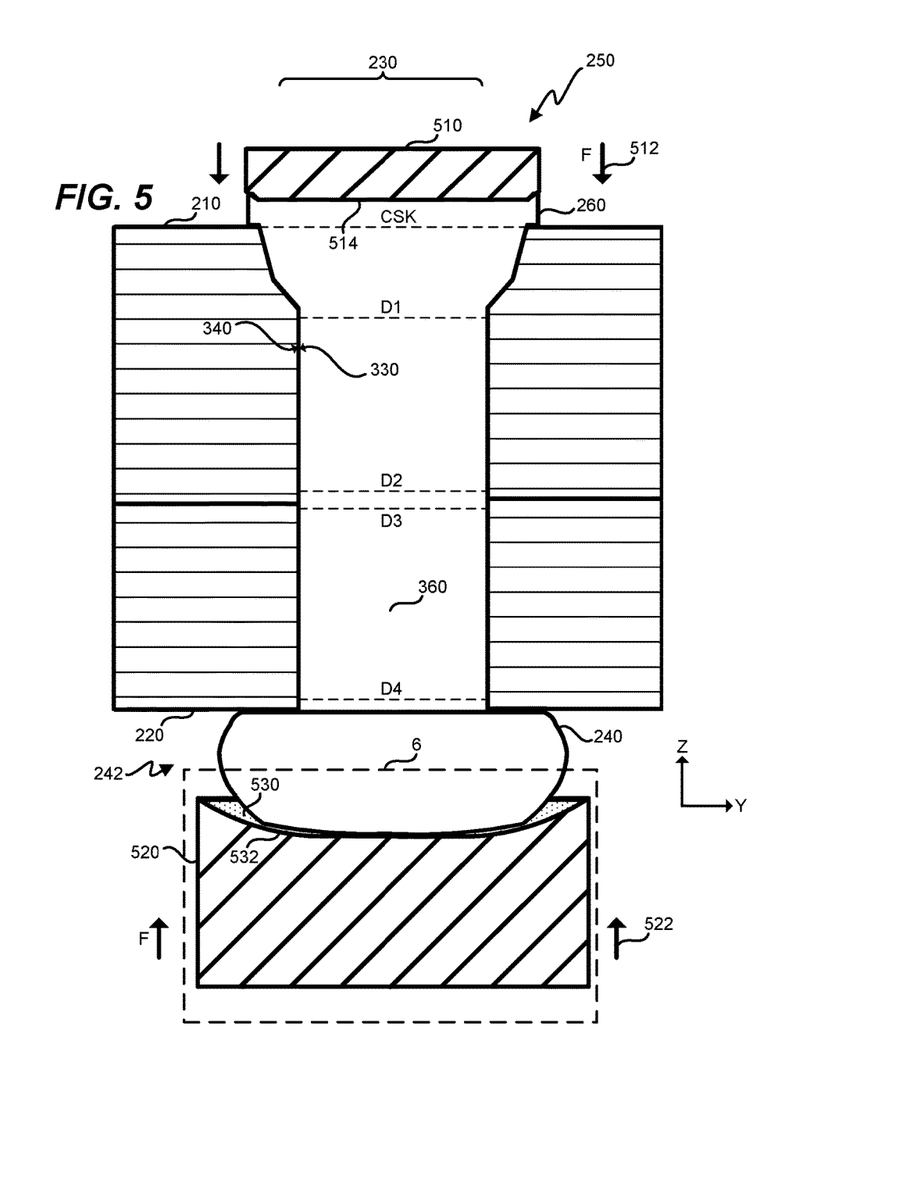
FIG. 5 is a zoomed in view of installation of a fastener at a hole in an exemplary embodiment.

FIGS. 1-3 illustrate exemplary environments in which a fastener may be installed, while FIGS. 4-5 illustrate exemplary installation of a fastener, and FIGS. 6-9 illustrate the exemplary operations of tooling designed to install a fastener.

FIG. 1 illustrates the structure of an exemplary aircraft that may utilize enhanced fasteners. Specifically, FIG. 1 is a diagram of an aircraft 100 in an exemplary embodiment. Aircraft 100 includes nose 110, wings 120, fuselage 130, and tail 140.

FIG. 2 is a partial section cut view of a section of wing 120 of aircraft 100 indicated by view arrows 2 in FIG. 1. As shown in FIG. 2, wing skin 200 comprises multiple composite or metal parts (210, 220). For example, parts 210 and 220 may comprise aluminum components having thickness T1 and a thickness T2, respectively. Holes 230 bridges parts 210 and 220. Fasteners 250 are driven through holes 230 and installed in interference with holes 230. Head end 260 is countersunk into hole 230. In some embodiments, head end 260 may be shaved flush with part 210. Fasteners 250 are plastically deformed to secure parts 210 and 220 together. In this embodiment, fasteners 250 are aluminum rivets which are each secured by plastically deforming the rivet, expanding the rivet in the hole, filling a countersink and forming a button 242. In further embodiments, fasteners 250 may comprise any suitable types of rivets (e.g., index head, protruding head (crown), slug) or even bolts which have a deformable tail.

FIG. 3 is a zoomed-in view of a section of a wing structure that includes a fastener 250 in an exemplary embodiment. FIG. 3 corresponds with region 3 of FIG. 2. FIG. 3 illustrates that parts 210 and 220 may each be an aluminum part. FIG. 3 further illustrates that fastener 250 includes countersink 320 and shaft 360. After securement, surface 330 of shaft 360 is placed into interference with surface 340 of hole 230. Button 240 is also further detailed as having a button diameter BD and a button height BH. BD is larger than a diameter (HD) of hole 230. In one embodiment, HD is less than one inch, such as three eighths of an inch.

When installed, fastener 250 is placed into interference with parts 210 and 220 along the entire length (LH) of hole 230. For example, interference is achieved at a first location 321 having a diameter CSK where countersink 320 meets a surface 212 of part 210, at a second location 361 having a diameter D1 just after countersink 320 terminates (e.g., twenty thousandths of an inch in the negative Z direction from location 322), at a third location 362 having a diameter D2 just before part 210 terminates (e.g., twenty thousandths of an inch in the positive Z direction from location 365), at a fourth location 363 having a diameter D3 just after part 220 initiates (e.g., twenty thousandths of an inch in the negative Z direction from location 365), and at a fifth location 364 having a diameter D4 just before part 220 terminates (e.g., twenty thousandths of an inch in the positive Z direction from location 367). In one embodiment where HD is three eighths of an inch, plastically deforming fastener 250 generates interference between the hole and the fastener at each of locations 321 and 361-364 by an amount less than twenty thousandths of an inch. As used herein, location 365 may also be referred to as the interface between part 210 and part 220.

FIG. 4 is a view of fastener 250 prior to installation within hole 230 in an exemplary embodiment. FIG. 4 illustrates but one of numerous different types of rivets or other fasteners that may be utilized (e.g., protruding head rivets). As shown in FIG. 4, tail end 242 of fastener 250 has not yet been plastically deformed into button 240, and head end 260 has also not yet been deformed. The length (LF) of fastener 250 is also illustrated.

FIG. 5 is a zoomed in view of installation of a fastener 250 at a hole 230 in an exemplary embodiment. FIG. 5, just like FIG. 3, corresponds with region 3 of FIG. 2. FIG. 5 illustrates that fastener 250 is plastically deformed by dies 510 and 520 applying force (F) and directions 512 and 522, respectively. In further embodiments, one or both of the dies are driven to apply force. This force is higher than the yield strength of the rivet material (e.g., aluminum), causing the rivet to plastically deform (i.e., permanently reshape). FIG. 5 further illustrates that a surface 530 (shaped as a cup 532) of die 520 contacts tail end 242 and plastically deforms tail end 242 into button 240. Similarly, surface 514 of die 510 contacts head end 260 of fastener 250.

Figure 6:
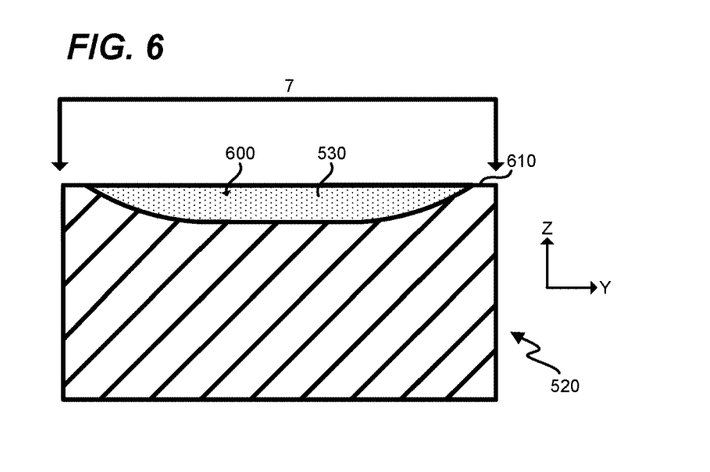
FIGS. 6-7 are zoomed in views of a die that includes a permanent coating with a low coefficient of friction in an exemplary embodiment.
Figure 7:
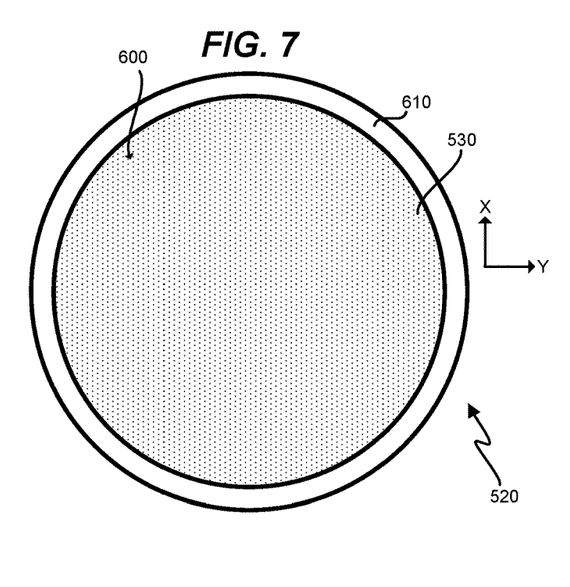

FIGS. 6-7 are zoomed in views of die 520 in an exemplary embodiment. FIG. 6 corresponds with region 6 of FIG. 5, and FIG. 7 corresponds with view arrows 7 of FIG. 6. FIGS. 6-7 illustrate that die 520 includes a permanent coating 600 at cup 532. Coating 600 has a low coefficient of friction. The coefficient of friction (e.g., the static coefficient of friction) for coating 600 is less than 0.2, may be in the range of 0.05 to 0.15, and may preferably be in the range of 0.05 to 0.10. Furthermore, coating 600 is permanent in that it has a wear life on par with that of die 520. For example, coating 600 may be utilized for tens or hundreds of thousands of cycles installing fasteners, unlike a sacrificial lubricant which is worn off regularly after a few cycles installing fasteners (e.g., less than one hundred cycles). Coating 600 may be applied to surface 530 only, or may be applied all along the exterior of die 520, including lip 610. Coating 600 may comprise Diamond-Like Carbon (DLC). DLC has a desirable Vickers hardness between 5,000 and 10,000, is engineered to withstand substantial wear, and has a low coefficient of friction µ ranging from 0.05 to 0.10. In such embodiments, coating 600 may actually increase the wear life of a die 520 or 510 by up to three times in comparison with uncoated dies.

Furthermore, DLC is a thin coating (e.g., ranging from 0.5 to 2.5 micrometers), and hence applying coating 600 to die 520 as a DLC coating does not substantially change the shape or dimensions of die 520. In a further embodiment, the properties of a DLC coating may be tailored by adjusting which phases of carbon are present in the DLC (e.g., adjusting amounts of graphite phase material and diamond phase material present in the DLC). In further examples, coating 600 may comprise a Poly-Crystalline Diamond (PCD) coating having a thickness between half of a micrometer and two and a half micrometers. In some embodiments, it is desirable for coating 600 to have a Vickers hardness greater than five thousand, such as between eight hundred and ten thousand (for example, between five thousand and ten thousand).

Figure 8:
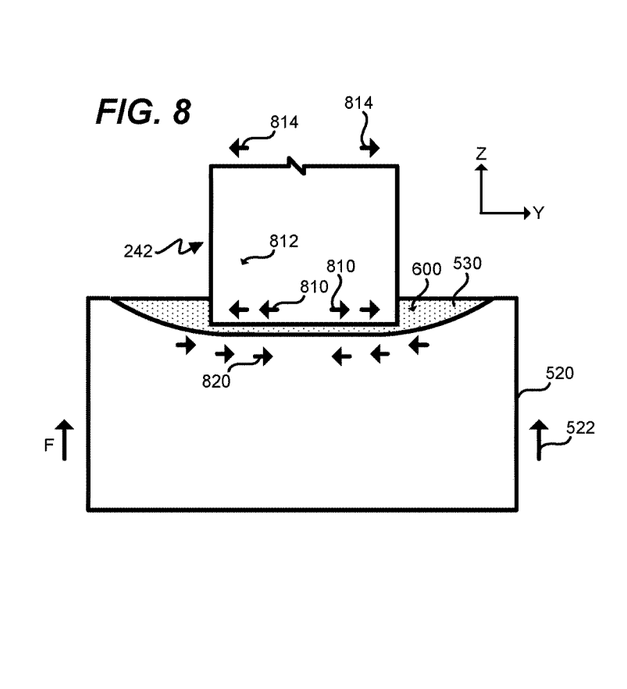
FIGS. 8-9 are zoomed in views of a die plastically deforming a tail end of a fastener in an exemplary embodiment.
Figure 9:
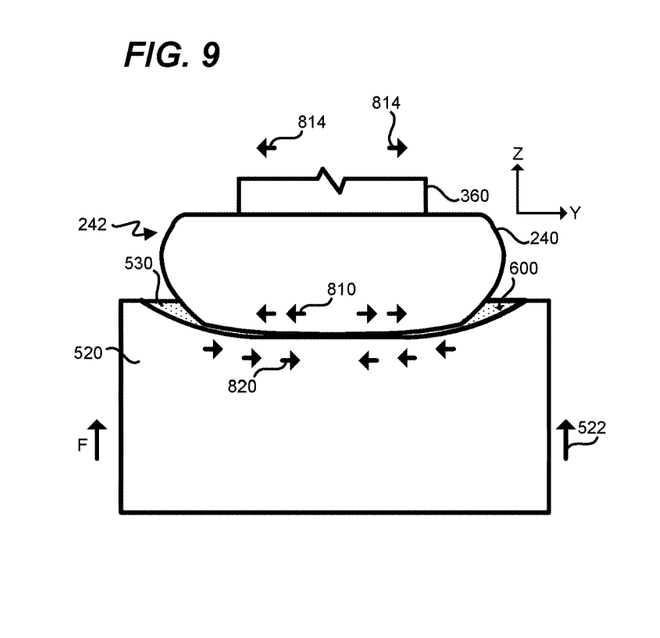

FIGS. 8-9 are zoomed in views of a die 520 plastically deforming a tail end 242 of a fastener in an exemplary embodiment. FIGS. 8-9 illustrate that as die 520 proceeds in direction 522, applied contact force (F) from surface 530 causes material 812 to experience deformation. This also results in some friction with surface 530 in the directions indicated by arrows 810. The applied force causes material 812 (from which fastener 250 is formed) to flow. As material 812 flows, surface 530 experiences a corresponding frictional force indicated by arrows 820. This process continues until button 240 is fully formed. The flow of material caused by die 520 and die 510 pressing towards each other also causes some amount of material 812 within fastener 250 to flow into shaft 360, which results in columnar bulging 814 that causes interference (i.e., increases interference). Thus, expanding the fastener comprises forcing columnar bulging 814 at the fastener. If there is too little interference or too much interference between fastener 250 and hole 230, then the fatigue life is less than desired. Thus it is desirable to secure fastener 250 in place by achieving interference such that CSK, D1, D2, D3, and D4 are all within a desired range. In one embodiment, this range of interference is uniform along the length of fastener 250 (e.g., between one and a half and twenty thousandths of an inch, such as between three and eighteen thousandths of an inch). In further embodiments, the range of acceptable interference may vary depending on location, such that locations closer to head end 260 or tail end 242 have higher minimum and maximum values for interference than locations closer to the center of shaft 360. As the hardness of the parts being fastened by fastener 250 decreases, it also becomes harder to prevent interference levels from exceeding a tolerance range. The same effect occurs when T2 (of FIG. 2) is less than T1 (of FIG. 2).

Utilizing a coated die 520 helps to ensure that interference at tail end 242 of a rivet significantly drops. This is beneficial because often tail end and/or head end interference at D4 and D1, respectively, may be substantially larger than interference created mid-span between tail end 242 and head end 260, such as at D2 and D3. Increased interference at D2 and D3 increases fatigue strength of the joint, and when combined with interference reduced below typical levels at D1 and D4, significantly increases fatigue life of the joint. When a uniform amount interference is desired along the length of fastener 250, a significant reduction in tail side interference therefore provides a benefit. Utilizing a coated die 520 also significantly improved process repeatability, allows for the application of greater force during installation, and ensures that the process is less sensitive to other variables such as rivet variation, variation in parts 210 and 210, and minor lubricant contamination. The significant reduction in tail side interference and the improved repeatability has therefore allowed for changes in the process that improve interface and countersink interference, thereby achieving improved fatigue life of the fastened joint.

The advantageous interference characteristics of fastener 250 as installed by dies 510 and 520 result from dies 510 and 520 having smaller coefficients of friction than uncoated dies. When higher-friction dies are utilized, more force applied by the dies is applied radially at tail end 242 (and/or head end 260). This results in material 812 flowing from button 240 into shaft 360 proximate to D4, meaning that more material 812 is forced in the radial direction. Hence, interference is undesirably increased by a larger than desired amount at, for example, D4 than at D2 and D3. This means that more material flows to D4 at the expense of material flowing to D2 or D3. In contrast, when lower-friction dies are utilized, more force is applied and/or transmitted axially down shaft 360 of fastener 250, especially to the region where parts 210 and 220 meet proximate to D2 and D3. This means that interference is primarily caused by columnar bulging of shaft 360 (e.g., axial deformation), instead of by material 812 flowing radially from button 240 into shaft 360 proximate to D4.

Phrased another way, when there is a great deal of friction at die 510 and/or 520, applied force flows material 812 intended for button 240 into shaft 360, resulting in substantially more interference at D4 than at D2 and D3. Hence, more friction results in more radial deformation from applied force. In contrast, when there is less friction at dies 510 and/or 520, the expansion of shaft 360 is more even, as the generated interference (e.g., at D4) results primarily from columnar bulging of shaft 360 instead of material flowing into shaft 360 from button 240. Hence, less friction results in more axial force being applied/transmitted along shaft 360.

Furthermore, it remains important to emphasize that mere lubrication of the fastener 250 at shaft 360 fails to achieve beneficial results in regards to interference, because lubrication of shaft 360 actually increases the amount of interference experienced throughout hole 230 when fastener 250 is plastically deformed in place. Use of any sacrificial lubricants (e.g., cetyl alcohol) at tail end die 520 would present a substantial chance of fastener 250 being contaminated with lubricant. This would result in amounts of interference that may lead to undesirable fatigue at hole 230. In short, application of a sacrificial, short-term lubricant is largely uncontrollable and may result in contamination of fasteners as button material flows during compression.

Illustrative details of the operation and fabrication of dies 510 and 520 will be discussed with regard to FIGS. 10-11. Assume, for this embodiment, that a technician wishes to install a large number of fasteners 250 in order to secure two different parts.

Figure 10:
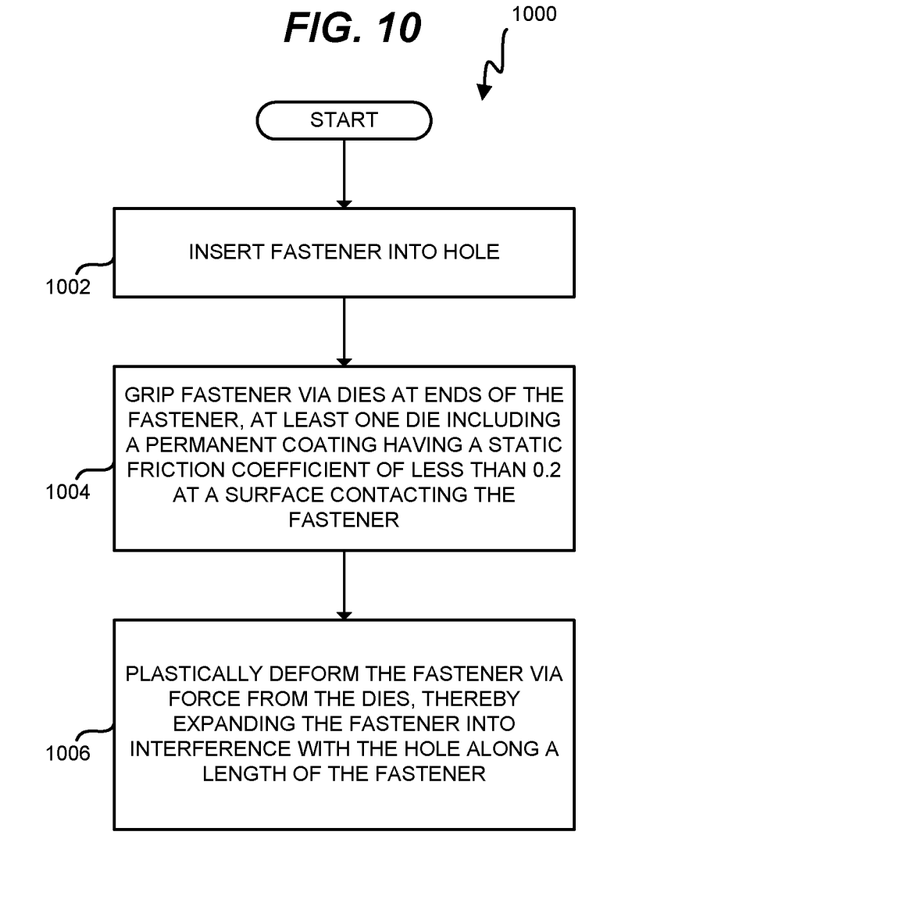
FIG. 10 is a flowchart illustrating a method for installing a fastener in an exemplary embodiment.

FIG. 10 is a flowchart illustrating a method 1000 for installing a fastener 250 in an exemplary embodiment. The steps of method 1000 are described with reference to dies 510 and 520 of FIG. 5, but those skilled in the art will appreciate that method 1000 may be performed in other systems. The steps of the flowcharts described herein are not all inclusive and may include other steps not shown. The steps described herein may also be performed in an alternative order.

As an initial process, the technician may engage in drilling and countersinking hole 230, or an automated machine may drill and countersink holes 230 in accordance with a Numerical Control (NC) program stored in memory. According to FIG. 10, fastener 250 is inserted into hole 230 (step 1002). At this point in time, fastener 250 has not yet been plastically deformed and hence appears as shown in FIG. 4. The technician may then utilize a tool that installs fasteners, and includes multiple dies in order to grip a fastener 250 at its ends. The tool grips fastener 250 via dies 510 and 520 as shown in FIG. 5 (step 1004). As discussed above, at least one of the dies (e.g., die 520) includes coating 600 at a surface that contacts fastener 250. This step may alternatively be performed by an automated machine in accordance with an NC program stored in memory. Dies 510 and 520 at tail end 242 and head end 260 are then pressed together while fastener 250 is gripped. This may comprise driving die 510 and/or die 520 towards each other. Thus, force from the dies is achieved by driving one or more of the dies towards each other. This action causes material at tail end 242 to flow around hole 230, forming button 240 having a diameter larger than a diameter of hole 230. In this manner, force from die 510 and/or die 520 plastically deforms fastener 250 to form an interference with hole 230. To reiterate, this process expands fastener 250 into interference with hole 230 all along the length of fastener 250 (step 1006).

In one embodiment, a majority of plastic deformation at fastener 250 along an entire axial length of fastener 250 results in interference caused by columnar bulging of shaft 350 in response to axial force from dies 510 and 520 and especially at the interface of the materials being joined. Thus, unlike systems which utilize uncoated dies which cause interference at D4 to primarily result from flow of material into shaft 360 due to radial frictional forces, dies 510 and 520 force a majority of interference along the entire length of shaft 360 (e.g., including D4) to be caused by columnar bulging. Step 1006 may result in interference along the entire length of fastener 250 being within a predefined range, especially at the interface of the materials being joined (e.g., between one and a half thousandths of an inch and twenty thousandths of an inch), may result in a ratio of interference between D1 and D2 (or between D3 and D4) being within a predefined range (e.g., two to one), etc. As the amount of interference of fastener 250 with hole 230 is more uniform, the fatigue life of the joint is improved. For example, that a ratio of a maximum amount of interference (e.g., at D4 or D1) to a minimum amount of interference (e.g., at D2 or D3) along the entire length of the fastener can be less than four. This process may be performed via an automated machine as described above for steps 1002-1004.

Dies 510 and 520 apply the substantial force to multiple fasteners without excessive wear or cracking of the die. After a period of time, such as after tens of thousands of cycles of fastener installation and securement, dies 510 and 520 may undergo sufficient wear to fail. In such cases, it is desirable to craft a replacement die.

Figure 11:
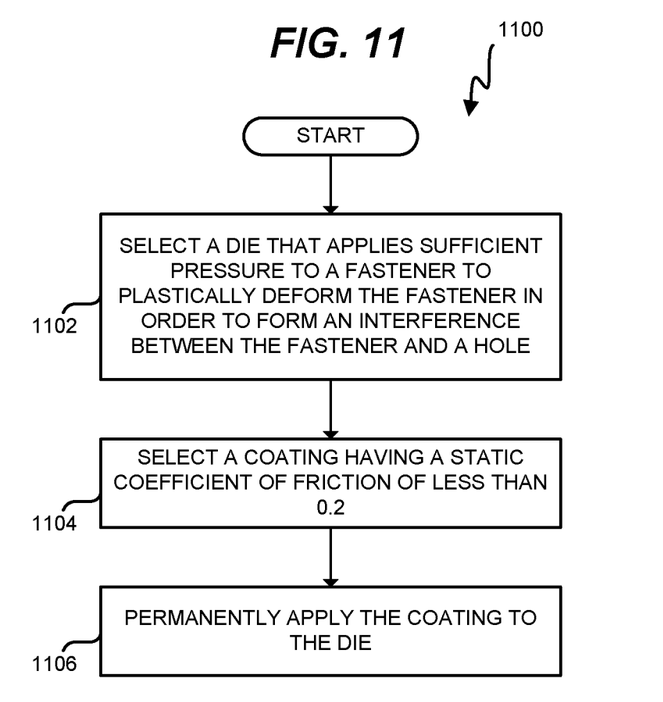
FIG. 11 is a flowchart illustrating a method for fabricating a die for installing a fastener in an exemplary embodiment.

FIG. 11 is a flowchart illustrating a method 1100 for fabricating a die 520 for installing a fastener in an exemplary embodiment. Specifically, FIG. 11 illustrates a method 1100 for fabricating a die with a permanent low friction coating that allows for enhanced material flow characteristics during fastener installation.

According to FIG. 11, an untreated, uncoated die is selected (step 1102). The die is capable of applying sufficient force to fastener 250 to plastically deform fastener 250. This forms an interference fit between fastener 250 and a hole 230. Selecting the die may comprise fabricating the die, or choosing the die from one of multiple available dies that have already been manufactured.

With a die selected, method 1100 continues and a coating is selected that has a static friction coefficient of less than 0.2 (step 1104). The coating may be selected via any suitable technique, so long as the coating 600 exhibits desired physical characteristics. In one embodiment, the coating 600 is further selected to have a Vickers hardness value of greater than five thousand, such as between five thousand and ten thousand. This ensures that the wear life of the coating is sufficient for use in a manufacturing environment where tens of thousands of fasteners are installed on a daily basis (such as in the aerospace industry).

With a coating 600 selected, the coating 600 is permanently applied to the die at a surface 530 that will contact fastener 250. Coating 600 may be applied to surface 530 via any suitable processes including Physical Vapor Deposition (PVD), Chemical Vapor Deposition (CVD), sputter deposition, ion beam deposition, cathodic arc deposition, etc. In any case, coating 600 is firmly adhered to die 520, in that it is fused, baked, or otherwise firmly adhered onto/integral with die 520. In a further embodiment, both dies 510 and 520 (e.g., as used by a tool) include coating 600 at the completion of method 1100. Coating 600 is "permanent" in that coating 600 does not rub off of the die during ordinary use (e.g., after a few applications, as would be common with a sacrificial lubricant), but rather fails after a much longer period of time (e.g., when the die itself fails after a hundred thousand cycles). To reiterate, dies 520 and 510 do not include a sacrificial lubricant, but rather a permanent coating 600.

EXAMPLES

In the following examples, additional processes, systems, and methods are described in the context of systems that install fasteners in order to secure structural components of an aircraft.

Figure 12:
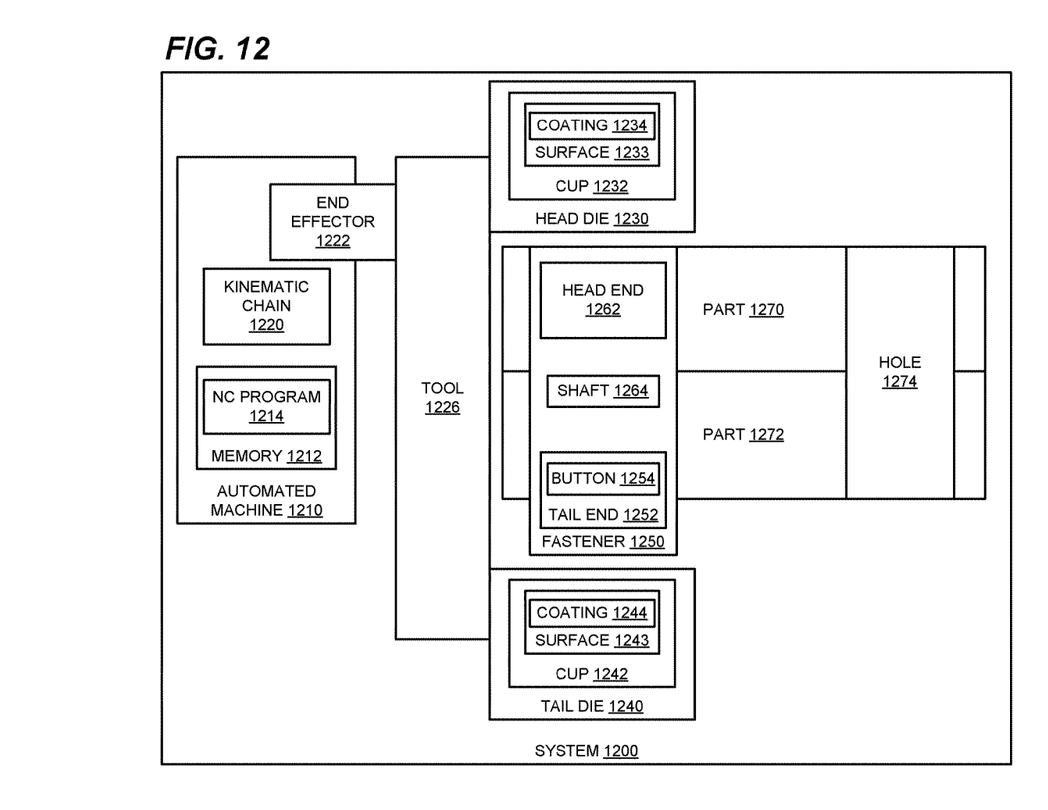
FIG. 12 is a block diagram of a fastener installation system in an exemplary embodiment.

FIG. 12 is a block diagram of a fastener installation system 1200 in an exemplary embodiment. According to FIG. 12, system 1200 includes automated machine 1210, which automatically installs fasteners 1250 into holes 1274 and secures fasteners 1250 in place to secure parts 1270 and 1272 together. In this embodiment, automated machine 1210 includes memory 1212, which stores NC program 1214 having instructions which indicate locations at which to place fasteners 1250. For example, the instructions may indicate controlling how to apply a specified force, including upset profile, maximum force, dwell time, etc. Automated machine 1210 moves end effector 1222 via kinematic chain 1220 in accordance with instructions in NC program 1214. In this embodiment, end effector 1222 operates tool 1226, which may be a pressurized or hydraulic rivet gun. Tool 1226 includes multiple dies, including head end die 1230, having a surface 1233 (in the shape of cup 1232) with coating 1234, and tail die 1240, which includes its own surface 1243 (in the shape of cup 1242) and coating 1244. Dies 1230 and 1240 come together to grip fastener 1250, and apply sufficient force to fastener 1250 to plastically deform tail end 1252, form button 1254, and expand shaft 1264. Head end 1262 and shaft 1264 are also illustrated.

Figure 13:
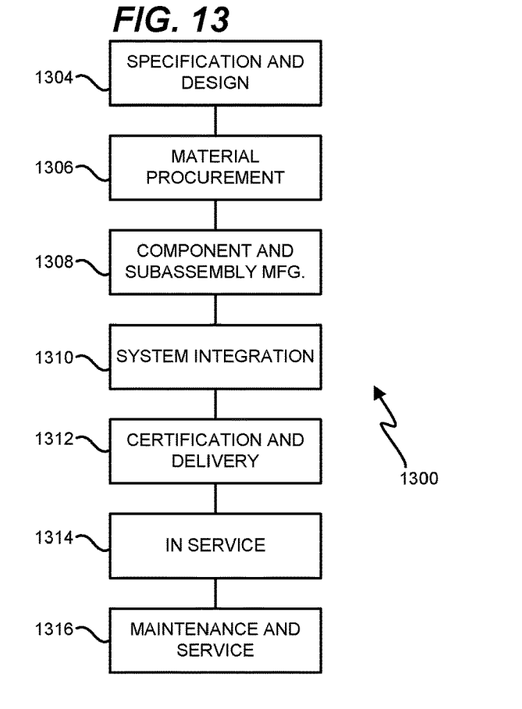
FIG. 13 is a flow diagram of aircraft production and service methodology in an exemplary embodiment.
Figure 14:
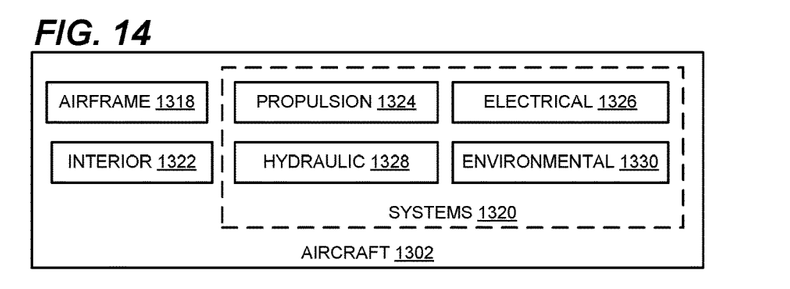
FIG. 14 is a block diagram of an aircraft in an exemplary embodiment.

Referring more particularly to the drawings, embodiments of the disclosure may be described in the context of an aircraft manufacturing and service method 1300 as shown in FIG. 13 and an aircraft 1302 as shown in FIG. 14. During pre-production, exemplary method 1300 may include specification and design 1304 of the aircraft 1302 and material procurement 1306. During production, component and subassembly manufacturing 1308 and system integration 1310 of the aircraft 1302 takes place. Thereafter, the aircraft 1302 may go through certification and delivery 1312 in order to be placed in service 1314. While in service by a customer, the aircraft 1302 is scheduled for routine maintenance and service 1316 (which may also include modification, reconfiguration, refurbishment, and so on). Apparatus and methods embodied herein may be employed during any one or more suitable stages of the production and service method 1300 (e.g., specification and design 1304, material procurement 1306, component and subassembly manufacturing 1308, system integration 1310, certification and delivery 1312, service 1314, maintenance and service 1316) and/or any suitable component of aircraft 1302 (e.g., airframe 1318, systems 1320, interior 1322, propulsion 1324, electrical 1326, hydraulic 1328, environmental 1330).

Each of the processes of method 1300 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 14, the aircraft 1302 produced by exemplary method 1300 may include an airframe 1318 with a plurality of systems 1320 and an interior 1322. Examples of high-level systems 1320 include one or more of a propulsion system 1324, an electrical system 1326, a hydraulic system 1328, and an environmental system 1330. Any number of other systems may be included. Although an aerospace example is shown, the principles of the invention may be applied to other industries, such as the automotive industry.

As already mentioned above, apparatus and methods embodied herein may be employed during any one or more of the stages of the production and service method 1300. For example, components or subassemblies corresponding to production stage 1308 may be fabricated or manufactured in a manner similar to components or subassemblies produced while the aircraft 1302 is in service. Also, one or more apparatus embodiments, method embodiments, or a combination thereof may be utilized during the production stages 1308 and 1310, for example, by substantially expediting assembly of or reducing the cost of an aircraft 1302. Similarly, one or more of apparatus embodiments, method embodiments, or a combination thereof may be utilized while the aircraft 1302 is in service, for example and without limitation, to maintenance and service 1316. For example, the techniques and systems described herein may be used for steps 1306, 1308, 1310, 1314, and/or 1316, and/or may be used for airframe 1318 and/or interior 1322. These techniques and systems may even be utilized for systems 1320, including for example propulsion 1324, electrical 1326, hydraulic 1328, and/or environmental 1330.

In one embodiment, die 520 is utilized to install fasteners onto a portion of airframe 118, and operates during component and subassembly manufacturing 1108 in order to secure fasteners 250. These fasteners may facilitate system integration 1110 by holding together disparate parts, and then be utilized in service 1114 until wear renders fasteners 250 unusable. Then, in maintenance and service 1116, a fastener 250 may be discarded and replaced with a newly manufactured part via the operations of die 520. Die 520 may be utilized throughout component and subassembly manufacturing 1108 in order to install various fasteners 250.

Any of the various control elements (e.g., electrical or electronic components) shown in the figures or described herein may be implemented as hardware, a processor implementing software, a processor implementing firmware, or some combination of these. For example, an element may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, a control element may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific embodiments are described herein, the scope of the disclosure is not limited to those specific embodiments. The scope of the disclosure is defined by the following claims and any equivalents thereof.

The invention claimed is:

1. A method comprising:
inserting a fastener into a hole;
gripping ends of the fastener via dies, at least one of the dies including a permanent coating having a static friction coefficient of less than 0.2 at a surface contacting the fastener; and
plastically deforming the fastener via force from the dies, thereby expanding the fastener into interference with the hole along a length of the hole such that an amount of interference between the fastener and the hole along the length of the hole is greater than one and a half thousandths of an inch and less than twenty thousandths of an inch.

2. The method of claim 1 wherein:
plastically deforming the fastener comprises placing the permanent coating, having a Vickers hardness between five thousand and ten thousand, in contact with the fastener.

3. The method of claim 1 wherein:
plastically deforming the fastener is performed without applying a sacrificial lubricant to the dies.

4. The method of claim 1 wherein:
plastically deforming the fastener comprises placing the permanent coating, comprising Diamond-Like Carbon (DLC), in contact with the fastener.

5. The method of claim 1 wherein:
force from the dies is achieved by driving at least one of the dies towards another of the dies.

6. The method of claim 1 further comprising:
expanding the fastener comprises forcing columnar bulging at the fastener.

7. The method of claim 1 wherein:
both dies include the permanent coating.

8. A method comprising:
selecting a die that applies force which plastically deforms a fastener in order to expand the fastener into interference with a hole;
selecting a coating having a static coefficient of friction of less than 0.2; and permanently applying the coating to the die at a surface that will contact the fastener, thereby ensuring that plastic deforming of the fastener via force from the die will cause an amount of interference between the fastener and the hole along a length of the hole between one and a half thousandths of an inch and twenty thousandths of an inch.

9. The method of claim 8 wherein:
the coating has a Vickers hardness between five thousand and ten thousand.

10. The method of claim 8 wherein:
the coating comprises Diamond-Like Carbon (DLC).

11. The method of claim 8 wherein:
permanently applying the coating comprises applying the coating via Physical Vapor Deposition (PVD).

12. The method of claim 8 wherein:
permanently applying the coating comprises applying the coating via cathodic arc deposition.

13. The method of claim 8 wherein:
permanently applying the coating comprises applying the coating via sputter deposition.

14. The method of claim 8 wherein:
permanently applying the coating comprises applying the coating via ion beam deposition.

15. The method of claim 8 further comprising:
applying the coating at a thickness between 0.5 and 2.5 micrometers.

16. A system comprising:
multiple dies that secure a fastener at a hole, the dies comprising:
a first die that contacts a first end of the fastener; and
a second die that contacts a second end of the fastener,
the second die includes a permanent coating having a static friction coefficient of less than 0.2 at a surface contacting the fastener; and
the dies together apply force that plastically deforms the fastener, thereby expanding the fastener into interference with the hole along a length of the hole such that an amount of interference between the fastener and the hole along the length of the hole is greater than one and a half thousandths of an inch and less than twenty thousandths of an inch.

17. The system of claim 16 wherein:
the permanent coating has a Vickers hardness between five thousand and ten thousand.

18. The system of claim 16 wherein:
the permanent coating comprises Diamond-Like Carbon (DLC).

19. The system of claim 16 wherein:
the permanent coating comprises Poly-Crystalline Diamond (PCD).

20. The system of claim 16 wherein:
both dies include the permanent coating.

21. The system of claim 16 wherein:
the coating has a thickness between 0.5 and 2.5 micrometers.

22. A method comprising:
inserting a fastener into a hole;
gripping the fastener via dies at ends of the fastener, at least one of the dies including a permanent coating having a static friction coefficient of less than 0.2 at a surface contacting the fastener; and
plastically deforming the fastener via force from the dies, which results in columnar bulging that causes interference between the fastener and the hole along a length of the hole such that a ratio of a maximum amount of interference to a minimum amount of interference along the length of the hole is less than four.

23. The method of claim 22 wherein:
plastically deforming the fastener comprises placing the permanent coating, having a Vickers hardness between five thousand and ten thousand, in contact with the fastener.

24. The method of claim 22 wherein:
plastically deforming the fastener is performed without applying a sacrificial lubricant to the dies.

25. An apparatus comprising:
a first part;
a second part; and
a fastener placed within a hole that bridges the first part and the second part, the fastener securing the first part and second part together,
the fastener has been plastically deformed, thereby expanding the fastener into interference with the hole along a length of the hole, such that a ratio of a maximum amount of interference to a minimum amount of interference along the length of the hole is less than four.

26. The apparatus of claim 25 wherein:
the fastener comprises a rivet.

27. The apparatus of claim 25 wherein:
interference between the fastener and the hole along the length of the fastener is between one and a half thousandths of an inch and twenty thousandths of an inch.

28. A method comprising:
inserting a fastener into a hole;
gripping ends of the fastener via dies; and
plastically deforming the fastener into interference with the hole via force from the dies,
a majority of plastic deformation at the fastener along an entire axial length of the fastener results in interference caused by columnar bulging of a shaft of the fastener in response to axial force from the dies such that an amount of interference between the fastener and the hole along the length of the hole is greater than one and a half thousandths of an inch and less than twenty thousandths of an inch.

29. The method of claim 28, wherein:
the dies include a permanent coating having a static friction coefficient of less than 0.2 at a surface contacting the fastener.

30. The method of claim 29 further comprising:
plastically deforming the fastener comprises placing the permanent coating, having a Vickers hardness between five thousand and ten thousand, in contact with the fastener.

* * * * *